(12) United States Patent
Sundquist

(10) Patent No.: US 10,361,064 B1
(45) Date of Patent: Jul. 23, 2019

(54) BEAM COMBINER

(71) Applicant: National Electrostatics Corp., Middleton, WI (US)

(72) Inventor: Mark L. Sundquist, Village of Shorewood Hills, WI (US)

(73) Assignee: National Electrostatics Corp., Middleton, WI (US)

(*) Notice: Subject to any disclaimer, the term of this patent is extended or adjusted under 35 U.S.C. 154(b) by 0 days.

(21) Appl. No.: 15/938,732

(22) Filed: Mar. 28, 2018

Related U.S. Application Data

(60) Provisional application No. 62/636,515, filed on Feb. 28, 2018.

(51) Int. Cl.
| | |
|---|---|
| *H01J 37/12* | (2006.01) |
| *H01J 37/28* | (2006.01) |
| *H01J 49/48* | (2006.01) |
| H01J 37/317 | (2006.01) |

(52) U.S. Cl.
CPC .............. *H01J 37/28* (2013.01); *H01J 37/12* (2013.01); *H01J 49/48* (2013.01); *H01J 37/3177* (2013.01); *H01J 2237/04924* (2013.01); *H01J 2237/151* (2013.01)

(58) Field of Classification Search
CPC ........ H01J 37/12; H01J 37/28; H01J 37/3177; H01J 2237/04924; H01J 2237/151; H01J 49/48
See application file for complete search history.

(56) References Cited

U.S. PATENT DOCUMENTS

| | | | | |
|---|---|---|---|---|
| 5,236,537 | A | * 8/1993 | Asaka | .................... H01L 21/467 |
| | | | | 156/345.31 |
| 5,356,870 | A | * 10/1994 | Fujiwara | ............... C04B 41/009 |
| | | | | 204/192.35 |
| 5,357,107 | A | 10/1994 | Ibach et al. | |
| 5,374,318 | A | 12/1994 | Rabalais et al. | |
| 6,617,587 | B2 | 9/2003 | Parker et al. | |
| 6,734,428 | B2 | 5/2004 | Parker et al. | |
| 8,309,936 | B2 | 11/2012 | Kreckel et al. | |

(Continued)

OTHER PUBLICATIONS

M.O.A. El Ghazaly et al., "An ion-beam injection line for the ELASR storage ring at KACST," Nuclear Instruments and Methods in Physics Research A, 806 (2016) pp. 36-42, available on-line Oct. 3, 2015, www.elsevier.com/locate/hima.

(Continued)

*Primary Examiner* — David E Smith
(74) *Attorney, Agent, or Firm* — Stiennon & Stiennon

(57) ABSTRACT

An electrostatic particle beam combiner for creating a single source combining the properties of two particle beams which form a high brightness source of a selected mixture of ions of varying element types and energies. An electrostatic spherical lens is arranged to bend a low energy second particle beam along a circular path and thereafter to impinge on a surface of a sample, e.g., within a transmission electron microscope. A beam of high energy is injected into the electrostatic spherical lens through an aperture in the outer shell and steered by two spaced apart electrostatic deflectors so that the angle of entry and the point of entry can be independently adjusted so that the high energy beam leaves the spherical lens along a path which is coaxial and coincident with the second particle beam of low energy.

10 Claims, 3 Drawing Sheets

(56) References Cited

U.S. PATENT DOCUMENTS

| | | |
|---|---|---|
| 9,437,408 B2 | 9/2016 | Wannberg |
| 2010/0072360 A1* | 3/2010 | Green ................. H01J 49/0072 |
| | | 250/282 |
| 2011/0163068 A1* | 7/2011 | Utlaut ....................... G03F 1/84 |
| | | 216/66 |
| 2015/0255248 A1 | 9/2015 | Boguslaysky et al. |

OTHER PUBLICATIONS

Electrostatic Energy Analyzers, Advances in Imaging and Electron Physics, vol. 157, pp. 214-258, (2009).
F.W. Meyer et al., "The ORNL multicharged ion research facility upgrade project," Nuclear Instruments and Methods in Physics Research B 242 (2006) pp. 71-78, available online Oct. 18, 2005, www.sciencedirect.com.
Prior Art Magnetic Beam Combiner, Admitted Prior Art.

\* cited by examiner

US 10,361,064 B1

BEAM COMBINER

CROSS REFERENCES TO RELATED APPLICATIONS

This application claims priority on U.S. Provisional Application No. 62/636,515 filed on Feb. 28, 2018 which is incorporated herein by reference.

STATEMENT AS TO RIGHTS TO INVENTIONS MADE UNDER FEDERALLY SPONSORED RESEARCH AND DEVELOPMENT

Not applicable.

BACKGROUND OF THE INVENTION

The present invention relates to the use of ion beams as a tool to study radiation damage to materials. A beam of heavy ions can produce radiation damage at a rate of several orders of magnitude greater than in a reactor thus allowing rapid experiments to determine the probable reaction of a given material to the radiation flux associated with a nuclear reactor. It is known to use one, or several ion beams of different energies which converge on a sample mounted to an electron microscope to observe the reaction of a material to radiation damage. A neutron flux can be simulated by high energy large ions such as aluminum or iron which cause dislocations in the crystal structure of metals or other materials. Often the heavy ions which simulate the neutron damage are combined with a second lower energy beam of ionized hydrogen or helium which simulates the formation of helium and hydrogen gas from protons or alpha particles. The combination of the two beams: a high energy beam when producing crystal defects or dislocations, and a low-energy beam which deposits ions which form the gases which can fill or create voids in the crystal structure producing characteristic swelling encountered in reactor materials over long periods of time.

In one known arrangement, a high energy beam and a low energy beam have been combined by using magnetic lenses so that the single combined beam deposits high energy ions and low-energy gas forming ions on a substrate under test within an electron microscope combining the elements of radiation damage, crystal dislocations and gas formation. However, magnetic lenses are energy use intensive and may affect the electrons used in the electron microscope. Further, a steering magnet applies a force which is proportional to the velocity and the velocity is inversely proportional to mass. Thus for a given beam energy, different isotopes of the same energy will not be bent by the same amount.

What is needed is a device for combining two or more ion beams of dramatically different energies using electrostatic lenses.

SUMMARY OF THE INVENTION

An electrostatic beam combiner having a first particle beam source of high energy of 200 keV to a few MeV and a second particle beam source of low energy of 10 to about 50 keV. An electrostatic spherical analyzer having an inner shell forming a portion of a sphere with a first radius and an outer shell forming a portion of a sphere with a second radius which is greater than the first radius where the inner shell and outer shell have a common center so the inner shell and outer shells are concentric. A voltage applied between the inner and outer shells so as to bend the second particle beam of low energy along a curve with a radius between the first and second radii to direct the second particle beam of low energy to impinge on a surface of a sample, e.g., within a transmission electron microscope. The first particle beam of high energy is injected into the electrostatic spherical analyzer through an aperture in the outer shell. The aperture allows the first particle beam of high energy to be steered by two spaced apart electrostatic deflectors so that the angle of entry and the point of entry can be independently adjusted so that the first particle beam of high energy leaves the electrostatic spherical analyzer along a path which is coaxial and coincident with the second particle beam of low energy. This arrangement of the two particle beams creates a single source combining the properties of both particle beams. Such a combined beam can be used to cause a high brightness source of a selected mixture of ions of element types and energies. Such a high brightness source can produce material damage in minutes or hours which simulates years or decades of exposure in a reactor. The radiation material damage, at the atomic level, can be imaged in real time to elucidate underlying mechanisms giving rise to the radiation damage.

Further objects, features and advantages of the invention will be apparent from the following detailed description when taken in conjunction with the accompanying drawings.

DESCRIPTION OF THE PREFERRED EMBODIMENTS

Figure 1:
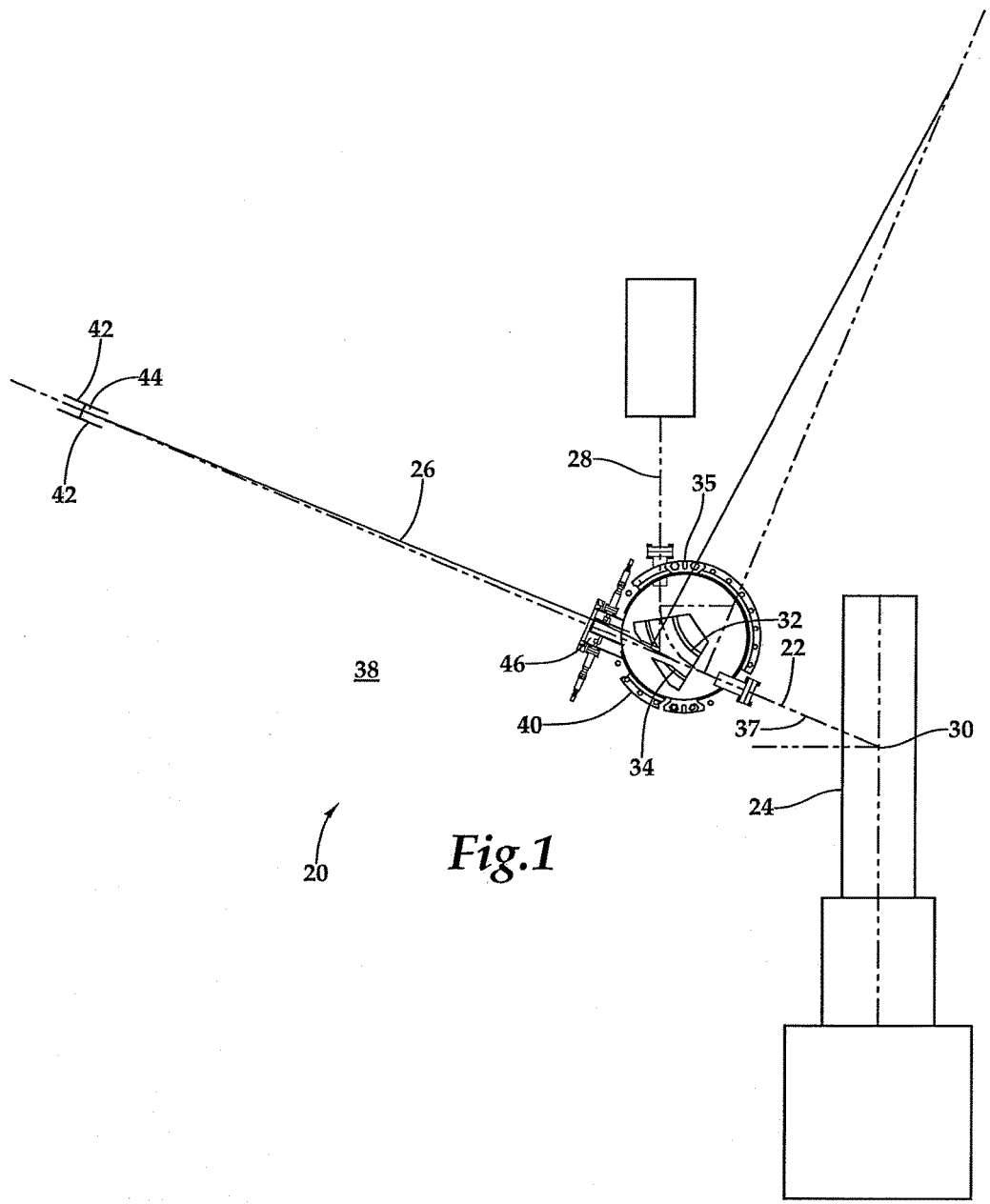
FIG. 1 is a schematic cross-sectional view of the beam combiner showing two ion beam sources and an electrostatic beam combiner supplying the combined beams to a transmission electron microscope.
Figure 2:
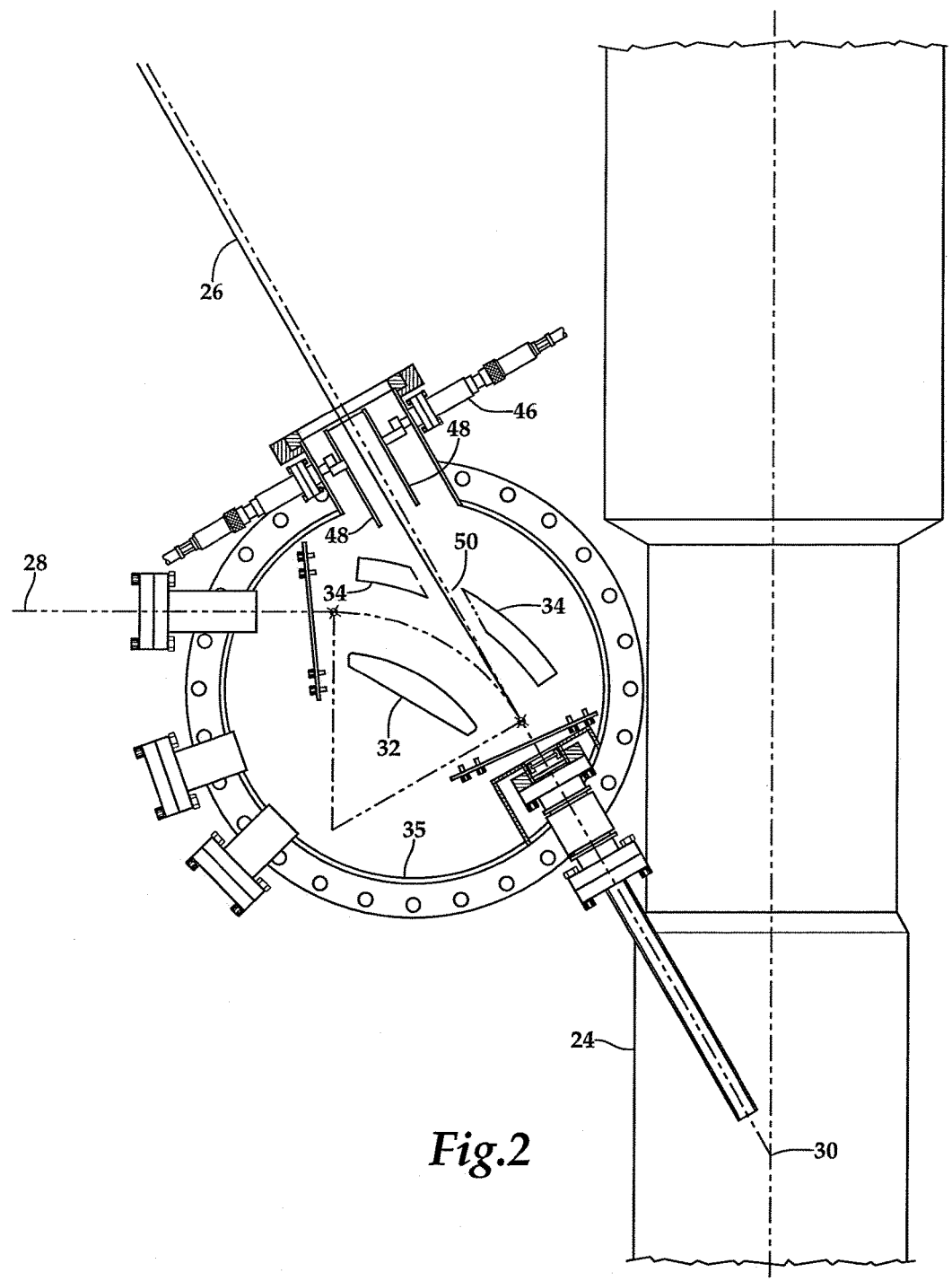
FIG. 2 is an enlarged cross-sectional view of the beam combiner of FIG. 1.

Referring more particularly to FIGS. 1-4 wherein like numbers refer to similar parts, a beam combiner apparatus 20 for forming a combined beam 22 of one or more beams 26 of high energy particles e.g., 200 keV to several MeV, with one or more beams 28 of low energy particles e.g., 10 keV to 50 keV as is shown in FIG. 1. One use of the beam combiner 20 is for simulating radiation damage in reactor materials. Radiation damage to materials within the nuclear reactor occur over the lifetime of the reactor which may be many decades. In order to develop new materials or to understand damage of existing materials, accelerated exposure to simulated neutron flux, alpha particle decay and x-rays can be simulated. Typical damage involves crystal dislocations and the swelling caused by helium or other gas formed as a result of nuclear reactions. Combining a high energy beam, generally consisting of one of the principal elements in the material, which produces crystal lattice damage, combined with a low energy beam such as helium such as produced from alpha particles, to closely reproduce the damage seen in materials over years or decades of exposure in a reactor. The combined beam 22 may be directed to a thin sample of material positioned for observation within a transmission electron microscope (TEM) 24 where the accumulation of radiation damage equivalent to two years or decades of reactor exposure can be simulated in minutes or hours. This allows direct observation of the damage over time with the possibility of better understanding how the damage is produced.

Referring to the example of radiation damage accumulation in reactor materials, the use of a high energy ion material such as iron, nickel, or zirconium can be used to produce damage in the sample crystal structure similar to that produced by a fast neutron flux. By using a heavy ion which forms a substantial part of the material sample, the damage produced is substantially limited to crystal structure damage, without the addition of any non-native elements. On the other hand, the low energy beam consisting of helium ions is implanted within the material as helium gas which is often present as a result of nuclear reactions. The helium gas is instrumental in producing damage caused by gas pressure buildup in crystal structures and avoids damage caused by the neutron flux as simulated by the high energy beam ions. The ions accelerated and their energies may be selected by the researcher according to their particular research objectives. Typically, the energies of the beams are selected to deposit energy at the same depth within the material sample 30 as shown in FIG. 3.

The low energy beam 28 (for example He+ at 30 keV) at as shown in FIG. 1 is generated from an ion source (not shown) and accelerated through a voltage of about 10 to 50 keV in an accelerator and supplied to a beam analyzer 40. The beam analyzer has a spherical electrostatic lens 36 mounted in a housing 35 and composed of an inner part 32 which forms a portion of a sphere of a first radius, and an outer part 34 of a second and larger radius. Both the inner and outer parts 32, 34 have the same center of curvature and subtend the same angle in the plane 38 illustrated in FIG. 1. The inner and outer parts 32, 34 of spherical lens 36 form a spherical space 52 between the inner and outer parts across which an electrostatic potential is applied. The low energy beam 28 enters the spherical lens 36 at a radius between the first and second radius and is bent by the lens approximately 70° in the plane as it transits the 60° of the spherical lens. As illustrated in FIG. 1, the analyzer is arranged to direct the low energy beam along an axis 37 to a sample 30 within a transmitting electron microscope. The high-energy beam 26 (for example Xe3+ at 800 kev) begins with an ion source (not shown) of generally higher atomic weight and is accelerated across a greater potential than the low energy beam, for example by an electrostatic potential created in a electrostatic accelerator, for example an accelerator of the type sold under name Pelletron®.

As shown in FIG. 1, the entry of the high-energy beam 26 is controlled by a first beam diverter 44 also known as a steerer which uses an adjustable electrostatic potential between two first plates 42 between which the beam passes. By adjusting the potential between the plates, a high-energy beam can be steered or bent in a plane perpendicular to the plates 42. The high-energy beam enters the beam analyzer through a second beam diverter 46 which also has two plates 48 which lie in the same planes as the first two plates 42 such that the high-energy beam is bent first in one direction at the first beam diverter 44, and is bent a second time in the opposite direction at the second beam diverter 46. The high-energy beam 26, thus twice bent, enters through a slot 50 in the outer part 34 of the spherical lens 36 best shown in FIG. 3. By thus bending the beam twice in the same plane and in opposite directions the point where the beam enters the space 52 between the inner and outer parts of the spherical lens 36 can be controlled both as to angle and entry point. The entry angle and the point being chosen such that the electrostatic field of the spherical lens 36 affects the high-energy beam 26 so as to bring it to the same axis 37 along which the low energy beam 28 travels as it is directed to the sample 30 within the transmitting electron microscope.

Figure 3:
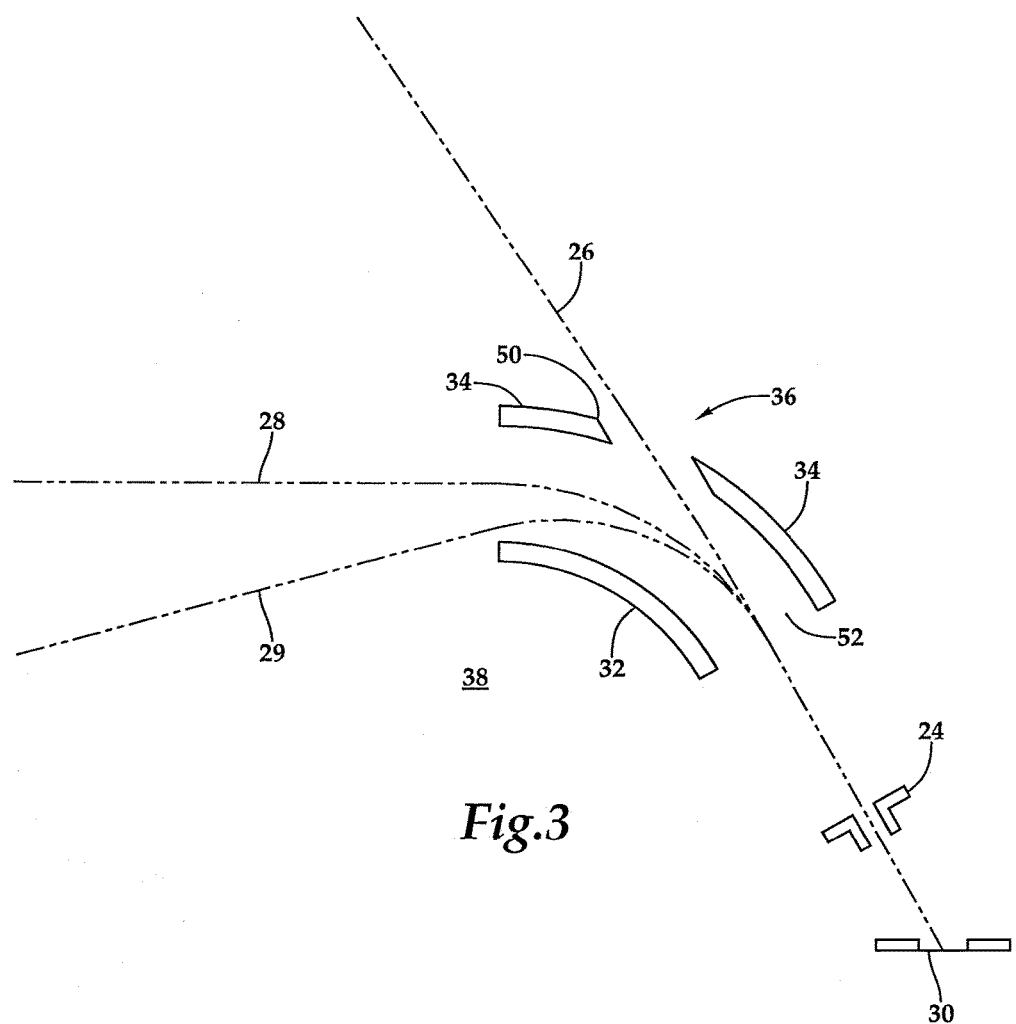
FIG. 3 is an enlarged cross-sectional of the spherical lens of the beam combiner of FIG. 1.

The combination of three particle beams is illustrated in FIG. 3 which shows one high-energy beam 26, for example, of zirconium, and two low energy beams, one 28, composed of, for example, helium, and another beam 29 composed of hydrogen. In a similar way additional high-energy beams can be combined through the same slot 50 or additional slots 51 depending on the beams' energies.

It will be understood that the beam combining apparatus 20 can be used whenever it is desirable to form a single beam containing two or more ion types each with a different energy.

Figure 4:
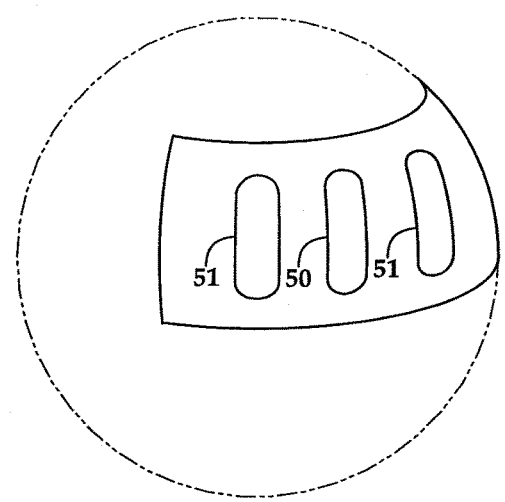
FIG. 4 is a perspective view of the formation of slots for beam entry through an outer part of the spherical lens of FIG. 3.

It should be understood that the beam slot may divide the outer part 34 into two parts both of which are held at the same potential, but more generally, the slot 50 will not necessarily divide the outer part but will simply extend long enough out of the plane 38 of FIG. 3 as shown in FIG. 4 such that the high-energy beam is not significantly affected by the lens 36 in the vertical plane.

As will be understood by a person skilled in the art that all parts of the beam combining apparatus 20 and the transmission of the beams between the low energy accelerator and the high-energy accelerator and electron microscope will be maintained at high vacuum typically by means of pipes connecting the components. It will further be understood that additional components for steering and focusing the beams, analyzing the beams and otherwise adjusting the apparatus 20 may form an integral part of the beam combining apparatus 20.

It should be understood that the elemental ions that are accelerated to form the ion beams 26, 28, 29 may be positively or negatively charged and can have charges stripped of or augmented by more than one electron.

It is understood that the invention is not limited to the particular construction and arrangement of parts herein illustrated and described, but embraces all such modified forms thereof as come within the scope of the following claims.

I claim:

1. An electrostatic beam combiner, comprising:
a first source of a first beam of first elemental ions having an energy of 100 keV to 4 MeV;
a second source of a second beam of second elemental ions having an energy of 10 to 70 keV;
an electrostatic spherical analyzer having an inner shell forming a portion of a sphere with a first radius and an outer shell forming a portion of a sphere with a second radius which is greater than the first radius where the inner shell and outer shell have a common center so the inner shell and outer shell are concentric and a voltage source applied between the inner and outer shell to form an electrostatic potential therebetween;
wherein the second source of the beam of second elemental ions is arranged to direct the second elemental ions between the inner shell and the outer shell so the second elemental ions are bent to follow a first path between the inner shell and the outer shell along a curve with a radius between the first and second radii and to direct the second elemental ions, after leaving the electrostatic spherical analyzer, to impinge on a surface of a sample along a selected axis;
wherein the first source of the first beam of first elemental ions is arranged to direct the first elemental ions through a gap or aperture in the outer shell of the electrostatic spherical analyzer such that the first elemental ions leave the electrostatic spherical analyzer to impinge on the surface of the sample along the selected axis;

a first beam diverter spaced from the outer shell of the electrostatic spherical analyzer, and formed by two spaced apart first plates with a first source of adjustable electrostatic potential applied between the two first plates;

a second beam diverter, spaced from the first beam diverter and arranged closely spaced from the gap or aperture in the outer shell of the electrostatic spherical analyzer;

wherein the second beam diverter is formed by two second spaced apart plates with a second source of adjustable electrostatic potential applied between the two second plates; and wherein the first source of adjustable electrostatic potential applied between the two first plates and the second source of adjustable electrostatic potential applied between the two second plates are selected to position the first beam of the first elemental ions to pass through a selected point at a selected angle in space such that the first elemental ions leave the electrostatic spherical analyzer along the selected axis.

2. The electrostatic beam combiner of claim 1 wherein the electrostatic spherical analyzer is mounted in a housing and the second beam diverter is mounted to the housing.

3. The electrostatic beam combiner of claim 1 wherein the second elemental ions are selected from the group consisting of hydrogen ions, deuterium ions, tritium ions, and helium ions.

4. The electrostatic beam combiner of claim 1 wherein the second elemental ions have atomic weights between 1 and 8 and the first elemental ions have atomic weights between 9 and 238.

5. The electrostatic beam combiner of claim 1 further comprising an electron microscope and wherein the sample is contained within the electron microscope.

6. An electrostatic beam combiner, comprising:
a first source of a first beam of first elemental ions having an energy of 100 keV to 4 MeV;
a second source of a second beam of second elemental ions having an energy of 10 to 70 keV;
an electrostatic spherical analyzer having an inner shell forming a portion of a sphere with a first radius and an outer shell forming a portion of a sphere with a second radius which is greater than the first radius where the inner shell and outer shell have a common center so the inner shell and outer shell are concentric and a voltage source applied between the inner and outer shell to form an electrostatic potential therebetween;
wherein the second source of the beam of second elemental ions is arranged to direct the second elemental ions between the inner shell and the outer shell so the second elemental ions are bent to follow a first path between the inner shell and the outer shell along a curve with a radius between the first and second radii and to direct the second elemental ions, after leaving the electrostatic spherical analyzer, to impinge on a surface of a sample along a selected axis;
wherein the first source of the first beam of first elemental ions is arranged to direct the first elemental ions through a gap or aperture in the outer shell of the electrostatic spherical analyzer such that the first elemental ions leave the electrostatic spherical analyzer to impinge on the surface of the sample along the selected axis;
wherein the second elemental ions have a first nucleus weight;
further comprising a third source of a third beam of third elemental ions having an energy of 10 to 70 keV and wherein the third elemental ions have a second nucleus weight which is less than the first nucleus weight;
wherein the third source of the third beam of third elemental ions is arranged to direct the third elemental ions between the inner shell and the outer shell so the third elemental ions are bent to follow a second path between the inner shell and the outer shell wherein the second path has a greater curvature than the first path between the first and second radii, and to direct the third elemental ions after leaving the electrostatic spherical analyzer along the selected axis.

7. An electrostatic beam combiner, comprising:
a first source of a first beam of first elemental ions having an energy greater than about 200 keV;
a second source of a second beam of second elemental ions having an energy of less than one fourth of the first elemental ions energy;
an electrostatic analyzer mounted to a housing and having an inner element and an outer element and a voltage source applied between the inner and outer elements to form an electrostatic potential therebetween;
wherein the second source of the beam of second elemental ions is arranged to direct the second elemental ions between the inner element and the outer element so the second elemental ions are bent to follow a path between the inner element and the outer element along a curve between the inner element and the outer element and direct the second elemental ions after leaving the electrostatic analyzer to impinge on a surface of a sample along a selected axis;
wherein the first source of the first beam of first elemental ions is arranged to direct the first elemental ions through a gap or aperture in the outer element of the electrostatic analyzer such that the first elemental ions leave the electrostatic analyzer to impinge on the surface of the sample along the selected axis;
a first beam diverter spaced from the outer shell of the electrostatic analyzer, and having a first source of adjustable electrostatic potential which is adjustable to change a first angle by which the first beam is diverted;
a second beam diverter, spaced from the first beam diverter and mounted to the housing of the electrostatic analyzer and having a second source of adjustable electrostatic potential which is adjustable to change a second angle by which the first beam is diverted; and
wherein the first source of adjustable electrostatic potential and the second source of adjustable electrostatic potential are selected to position the first beam of the first elemental ions to pass through a selected point at a selected angle in space such that the first elemental ions leave the electrostatic analyzer along the selected axis.

8. The electrostatic beam combiner of claim 7 wherein the second elemental ions are selected from the group consisting of hydrogen ions, deuterium ions, tritium ions, and helium ions.

9. The electrostatic beam combiner of claim 7 wherein the second elemental ions have atomic weights between 1 and 8 and the first elemental ions have atomic weights between 9 and 238.

10. The electrostatic beam combiner of claim 7 further comprising an electron microscope and wherein the sample is contained within the electron microscope.

* * * * *